United States Patent
Gomez et al.

(10) Patent No.: US 8,912,937 B2
(45) Date of Patent: Dec. 16, 2014

(54) HIGH EFFICIENCY OUTPUT STAGE AMPLIFICATION FOR RADIO FREQUENCY (RF) TRANSMITTERS

(71) Applicant: Broadcom Corporation, Irvine, CA (US)

(72) Inventors: Ramon Gomez, San Juan Capistrano, CA (US); Massimo Brandolini, Irvine, CA (US); Jiangfeng Wu, Irvine, CA (US); Kevin Lee Miller, Lawrenceville, GA (US); Hans Eberhart, Lomita, CA (US); Tianwei Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/768,713

(22) Filed: Feb. 15, 2013

(65) Prior Publication Data
US 2014/0184339 A1 Jul. 3, 2014

Related U.S. Application Data

(60) Provisional application No. 61/747,534, filed on Dec. 31, 2012.

(51) Int. Cl.
*H03M 1/66* (2006.01)
*H03F 3/19* (2006.01)
*H03F 3/21* (2006.01)

(52) U.S. Cl.
CPC .. *H03F 3/21* (2013.01); *H03F 3/19* (2013.01); *H03M 1/66* (2013.01)

USPC .......................................... 341/144; 330/284

(58) Field of Classification Search
CPC ........ H03F 1/3252; H03G 3/001; H03M 1/66
USPC ............ 341/144, 145; 330/254, 284; 375/297
See application file for complete search history.

(56) References Cited

U.S. PATENT DOCUMENTS

| | | | | |
|---|---|---|---|---|
| 5,886,573 A * | 3/1999 | Kolanek | ......................... | 330/10 |
| 6,236,273 B1 * | 5/2001 | Lewyn | ......................... | 330/297 |
| 6,697,004 B1 * | 2/2004 | Galton et al. | ................ | 341/144 |
| 8,618,968 B2 * | 12/2013 | Currivan et al. | .............. | 341/144 |
| 2008/0051044 A1 * | 2/2008 | Takehara | ...................... | 330/296 |
| 2008/0265822 A1 * | 10/2008 | Menegoli et al. | ............ | 330/297 |
| 2012/0183027 A1 * | 7/2012 | Currivan et al. | .............. | 375/222 |
| 2014/0049318 A1 * | 2/2014 | Goswami | ..................... | 330/253 |

* cited by examiner

*Primary Examiner* — Howard Williams
(74) *Attorney, Agent, or Firm* — Sterne, Kessler, Goldstein & Fox P.L.L.C.

(57) ABSTRACT

Highly power efficient transmitter output stage designs are provided. In an embodiment, the probability density function (PDF) of an input signal is divided into a plurality of regions, and samples of the input signal are processed depending on the region of the PDF within which they fall. The PDF can be divided between an inner region corresponding to samples of the input signal that are within a predetermined amplitude range, and outer regions corresponding to samples of the input signal that are outside of the predetermined amplitude range. Samples of the input signal that fall in the inner region are processed by a class A biased amplifier and samples of the input signal that fall in the outer regions are processed by a class B biased amplifier. Output stage designs according to embodiments can be implemented as power amplifiers or power digital-to-analog converters (DACs).

20 Claims, 13 Drawing Sheets

US 8,912,937 B2

HIGH EFFICIENCY OUTPUT STAGE AMPLIFICATION FOR RADIO FREQUENCY (RF) TRANSMITTERS

CROSS-REFERENCE TO RELATED APPLICATIONS

The present invention claims the benefit of U.S. Provisional Application No. 61/747,534, filed Dec. 31, 2012, which is incorporated herein by reference in its entirety.

BACKGROUND

1. Field of the Invention

The present disclosure relates generally to radio frequency (RF) transmitters.

2. Background Art

Many modern communication signals include multiple orthogonal carriers (e.g., OFDM, LTE, MoCA, etc.) and thus have a Gaussian or substantially Gaussian amplitude probability density function (PDF) and high Peak to Average Power Ratio (PAPR). Traditional power amplifiers (e.g., class A) have very low power efficiency (e.g., 1-2%) when handling peak events of these signals. Common solutions for improving the power efficiency of a power amplifier include varying the power supply provided to the amplifier as a function of the amplitude of the input signal. However, these solutions are limited by the bandwidth of the input amplitude tracking circuitry and therefore are inefficient for broadband modern communication signals (e.g., LTE, modern cable TV signals, etc.).

BRIEF DESCRIPTION OF THE DRAWINGS/FIGURES

The accompanying drawings, which are incorporated herein and form a part of the specification, illustrate the present disclosure and, together with the description, further serve to explain the principles of the disclosure and to enable a person skilled in the pertinent art to make and use the disclosure.

The present disclosure will be described with reference to the accompanying drawings. Generally, the drawing in which an element first appears is typically indicated by the leftmost digit(s) in the corresponding reference number.

DETAILED DESCRIPTION OF EMBODIMENTS

For purposes of this discussion, the term "module" shall be understood to include at least one of software, firmware, and hardware (such as one or more circuits, microchips, or devices, or any combination thereof), and any combination thereof. In addition, it will be understood that each module can include one, or more than one, component within an actual device, and each component that forms a part of the described module can function either cooperatively or independently of any other component forming a part of the module. Conversely, multiple modules described herein can represent a single component within an actual device. Further, components within a module can be in a single device or distributed among multiple devices in a wired or wireless manner.

Figure 1:
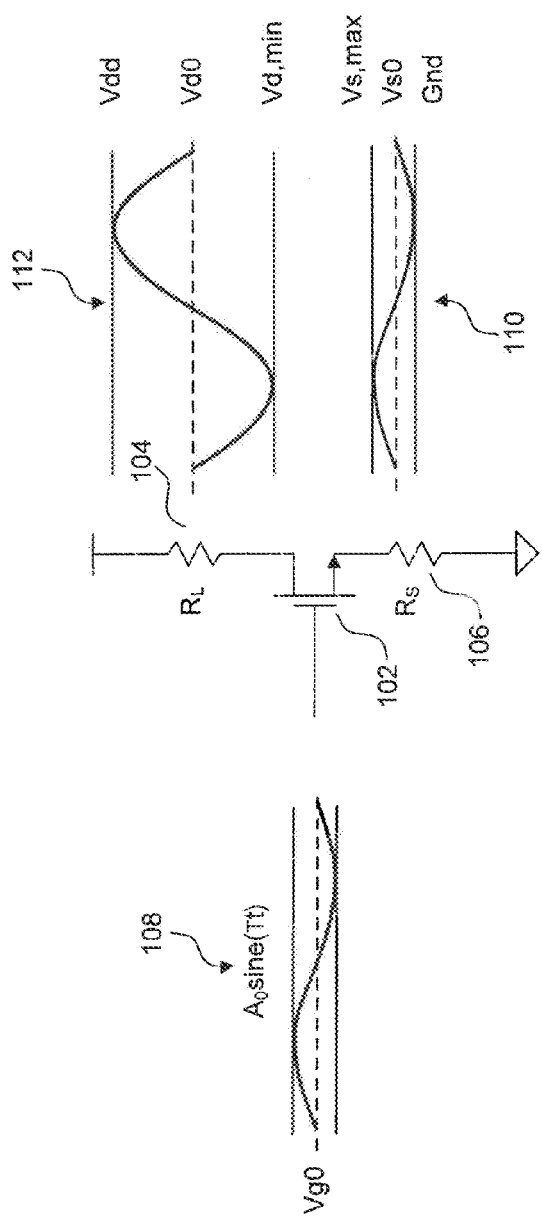
FIG. 1 illustrates an example class A amplifier.

FIG. 1 illustrates an example class A amplifier 100. As shown in FIG. 1, example class A amplifier 100 includes an NMOS (N-type metal oxide semiconductor) transistor 102, a pull-up resistor $R_L$ 104 coupled between a drain terminal of NMOS transistor 102 and a supply voltage, and a pull-down resistor $R_S$ 106 coupled between a source terminal of NMOS transistor 102 and ground.

In the example of FIG. 1, amplifier 100 receives a sine wave input signal 108 at a gate terminal of NMOS transistor 102, which produces a sine wave signal 110 at the source terminal of NMOS transistor 102 and a sine wave output signal 112 at the drain terminal of NMOS transistor 102. As shown in FIG. 1, output signal 112 can have a maximum voltage swing between a $V_{d,min}$ and $V_{dd}$, which corresponds to the supply voltage. Assuming that amplifier 100 has a high gain, output signal 112 can have a maximum peak swing of $V_{dd}/2$ and amplifier 100 can have a maximum power efficiency of 25%.

Figure 2:
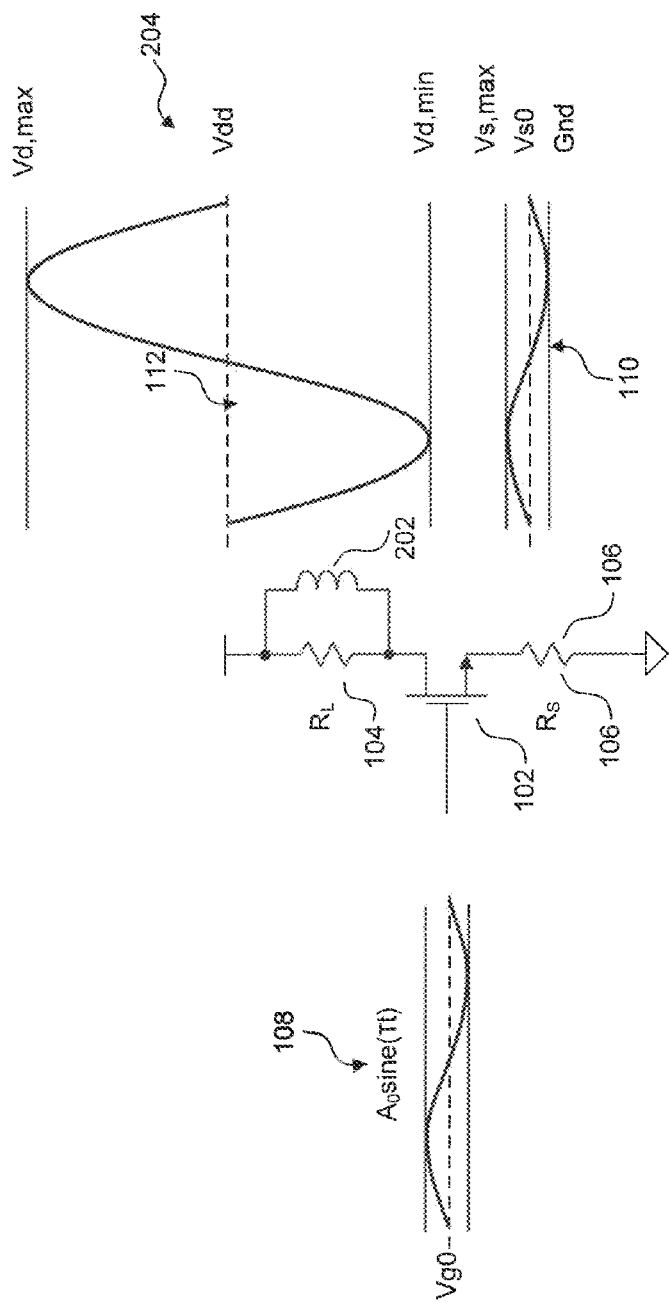
FIG. 2 illustrates an example class A amplifier with an output choke circuit.

FIG. 2 illustrates an example class A amplifier 200 with an output choke circuit 202, coupled across pull-up resistor $R_L$ 104. As Shown in FIG. 2, with the same sine wave input signal 108, amplifier 200 produces an output signal 204 with a voltage swing centered around $V_{dd}$ and that varies between $V_{d,min}$ and a $V_{d,max}$. Assuming that amplifier 200 has a high gain, output signal 204 can have a maximum peak swing of $V_{dd}$ and amplifier 200 can have a maximum power efficiency of 50%. Thus, amplifier 200 can have twice the power efficiency of amplifier 100.

Example amplifiers 100 and 200 are typically highly linear and therefore desirable for output stage amplification in radio frequency (RF) transmitters, for example. However, the linearity of example amplifiers 100 and 200 comes at the expense of low power efficiencies as illustrated above. These power efficiencies are further reduced in the case of typical modern communication signals. For example, many modern communication signals include multiple orthogonal carriers (e.g., OFDM, LTE, MoCA, etc.) and thus have a Gaussian or substantially Gaussian amplitude probability density function (PDF) and high Peak to Average Power Ratio (PAPR), for example on the order of 25. Typical efficiencies of example amplifiers 100 and 200 for such signals approach approximately 1% and 2% respectively for peak events of the signals.

Common solutions for improving the power efficiency of a transmitter output stage include varying the power supply provided to the stage as a function of the amplitude of the input signal. For example, an existing solution tracks the envelope of the input signal and modulates the power supply using a switching regulator based on the input signal envelope. However, this solution is bound by the maximum bandwidth of the switching regulator (e.g., 20 MHz) and therefore is inefficient for modern broadband communication signals (e.g., LTE, modern cable TV signals, etc.).

Embodiments as further described below provide highly power efficient transmitter output stage designs. Embodiments operate by dividing an input signal into multiple constituent signals based on the amplitude of the input signal, and then processing each of the multiple constituent signals with an appropriately biased respective amplifier. For example, in an embodiment, the PDF of an input signal is divided into a plurality of regions, and samples of the input signal are processed depending on the region of the PDF within which they fall. For example, the PDF can be divided between an inner region corresponding to samples of the input signal that are within a predetermined amplitude range (e.g., which occur with a high probability), and outer regions corresponding to samples of the input signal that are outside of the predetermined amplitude range (e.g., peak events, which occur with low probability). Samples of the input signal that fall in the inner region are processed by a class A amplifier and samples of the input signal that fall in the outer regions are processed by a class B amplifier. It is noted that class B amplification as used herein does not correspond to conventional class B amplification, wherein the amplifier conducts only 50% of the signal cycle time. Instead, class B amplification is used herein to describe amplification whereby the amplifier/DAC conducts all the time but where the conducting current is coupled to a low supply voltage for the unused portions of the signal cycle (rather than the amplifier itself being off). In an embodiment, the class B amplifier is biased with multiple supply voltages, resulting in a class ABG design. Output stage designs according to embodiments can be implemented as power amplifiers or power digital-to-analog converters (DACs) as further described below.

Figure 3:
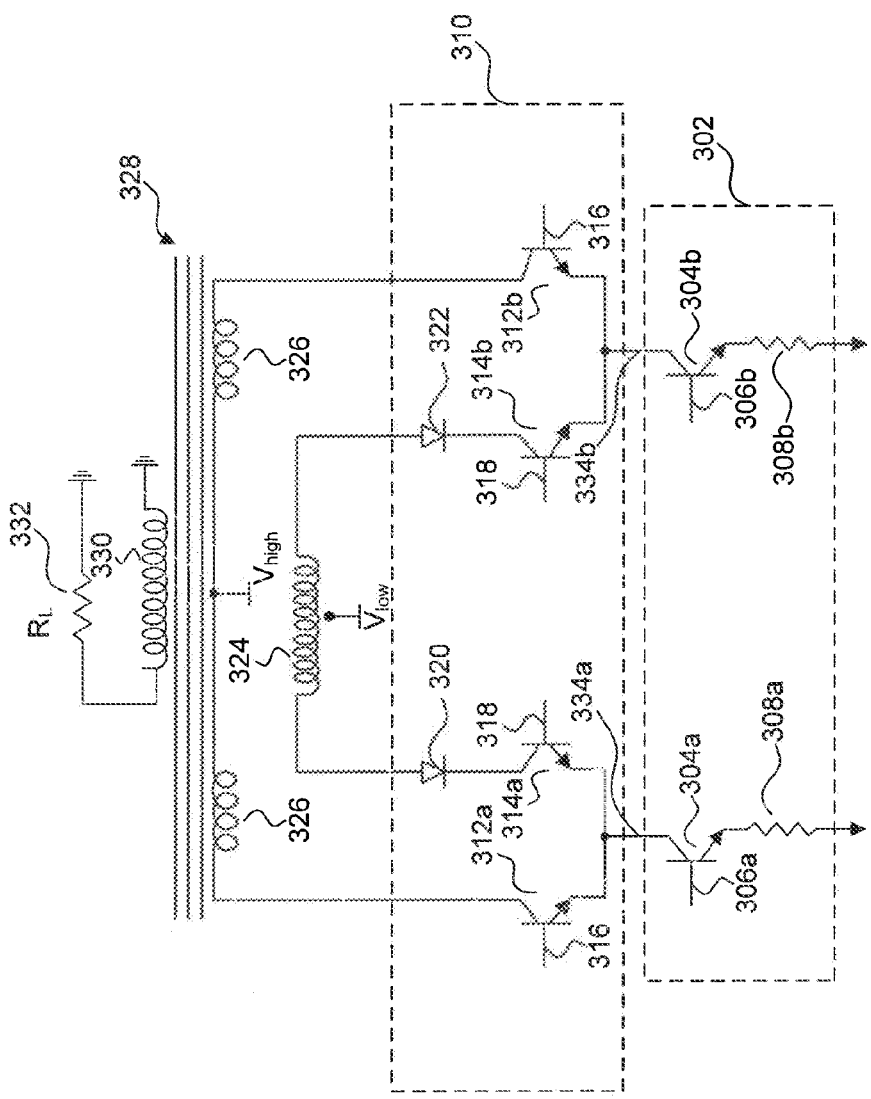
FIG. 3 illustrates an example class AB power amplifier according to an embodiment.

FIG. 3 illustrates an example class AB power amplifier (PA) 300 according to an embodiment. Example PA 300 is provided for the purpose of illustration and is not limiting of embodiments. For instance, example PA 300 employs a differential BJT (Bipolar Junction Transistor) implementation. Embodiments are not limited by this example implementation and extend to single-ended and/or MOS implementations, for example.

As shown in FIG. 3, example PA 300 includes an input stage 302, a current steering stage 310 and a combiner having a first winding 324, a second winding 326, and an output winding 330, all coupled to a same core 328. Output winding 330 is coupled to a load $R_L$ 332. In embodiments, first winding 324 and second winding 326 may or may not have the same ratio relative to output winding 330.

Input stage 302 includes transistors 304a and 304b and is configured to receive a differential input signal 306a-b at respective base terminals of transistors 304a and 304b. In an embodiment, the respective source terminals of transistors 304a and 304b are coupled to respective pull-down resistors 308a and 308b, which are coupled to ground, for example. Input stage 302 generates first and second current signals 334a and 334b.

Current steering stage 310 includes an inner segment that includes transistors 314a and 314b and an outer segment that includes transistors 312a and 312b. The terms "inner" and "outer" are used herein for the purpose of illustration only and do not have a structural or a functional association. Transistors 314a and 314b are controlled by a control signal 318, which is coupled to the respective base terminals of transistors 314a and 314b. Transistors 312a and 312b are controlled by a control signal 316, which is coupled to the respective base terminals of transistors 312a and 312b.

In an embodiment, control signals 318 and 316 are complementary signals, such that either transistors 312a-b or transistors 314a-b are turned on at any given time. For example, signal 318 and signal 316 can be logic low and logic high respectively when input signal 306a-b is outside a predetermined amplitude range (e.g., the absolute value of input signal 306a-b is above a predetermined amplitude threshold), and logic high and logic low respectively when input signal 306a-b is within the predetermined amplitude range (e.g., the absolute value of input signal 306a-b is below the predetermined amplitude threshold). As such, current steering stage 310 couples first and second currents 334a and 334b to first winding 324 of the combiner when input signal 306a-b is within the predetermined amplitude range, and to second winding 326 of the combiner when input signal 306a-b is outside the predetermined amplitude range. Current signals 334a-b are combined by the output winding 330 of the combiner to produce an output current in load $R_L$ 332.

In an embodiment, first winding 324 is biased at its center tap with a first supply voltage $V_{low}$, and second winding 326 is biased at its center tap with a second supply voltage $V_{high}$, which is higher than the first supply voltage. In an embodiment, the first and second supply voltages $V_{low}$ and $V_{high}$ are selected based on the predetermined amplitude range to enhance the amplification of the input signal. Current steering stage 310 thus selectively couples first and second currents 334a and 334b to the first supply voltage $V_{low}$ when the input signal is within the predetermined amplitude range, and to the second supply voltage $V_{high}$ when the input signal is outside the predetermined amplitude range. Accordingly, in an embodiment, low amplitude samples of input signal 306a-b (which in the case of a Gaussian input signal occur with a high probability) receive class A amplification and high amplitude samples of input signal 306a-b (which in the case of a Gaussian input signal occur with a low probability) received class B amplification. In another embodiment, multiple (mixed) supply voltages are used for high amplitude samples resulting in class BG amplification for those samples.

It should be noted that the combiner is not limited according to embodiments to a multi-winding flux-coupled transformer as illustrated in FIG. 3. As would be appreciated by a person of skill in the art based on the teachings herein, the combiner can be otherwise implemented as a transmission-line transformer (e.g., Guanella, Ruthroff, etc.), a microstrip, a stripline, or a Transverse ElectroMagnetic (TEM) coupler. For high frequency implementations, the combiner can also be implemented using hollow waveguide couplers.

Figure 13:
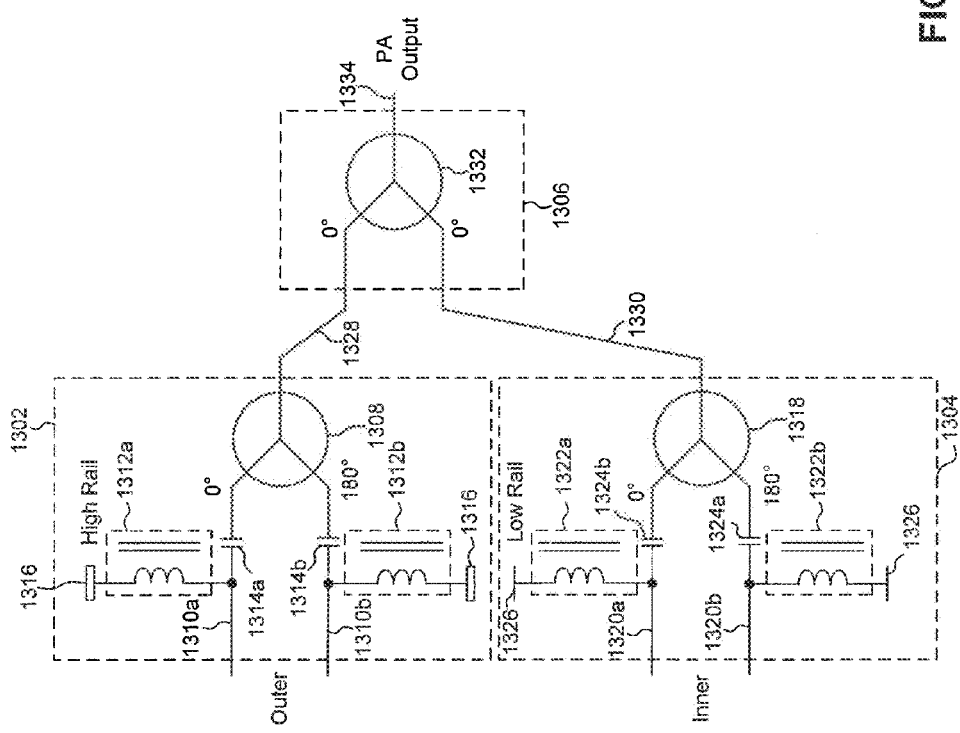
FIG. 13 illustrates an example combiner according to an embodiment.

For example, the combiner can be implemented as illustrated by example combiner 1300 shown in FIG. 13. Example combiner 1300 includes an outer segment 1302, an inner segment 1304, and an output segment 1306.

Outer segment 1302 is configured to receive inputs 1310a and 1310b and produce an output 1328. Inputs 1310a and 1310b may correspond to the outputs of the outer segment of current steering stage, 310 described above. In an embodiment, outer segment 1302 includes two input branches for receiving inputs 1310a and 1310b, respectively, and a combiner 1308. In an embodiment, choke or bias tee circuits 1312a and 1312b are used to couple the two input branches respectively to a high rail supply voltage 1316. Capacitors 1314a and 1314b are coupled between circuits 1312a and 1312b respectively and the inputs of combiner 1308. In an embodiment, combiner 1308 is an out-of-phase combiner, which combines input 1310a and a 180 degrees out-of-phase version of input 1310b, to produce output 1328.

Inner segment 1304 is configured to receive inputs 1320*a* and 1320*b* and produce an output 1330. Inputs 1320*a* and 1320*b* may correspond to the outputs of the inner segment of current steering stage 310 described above. In an embodiment, inner segment 1304 includes two input branches for receiving inputs 1320*a* and 1320*b*, respectively, and a combiner 1318. In an embodiment, choke or bias tee circuits 1322*a* and 1322*b* are used to couple the two input branches respectively to a low rail supply voltage 1326. Capacitors 1324*a* and 1324*b* are coupled between circuits 1322*a* and 1322*b* respectively and the inputs of combiner 1318. In an embodiment, combiner 1318 is an out-of-phase combiner, which combines input 1320*a* and a 180 degrees out-of-phase version of input 1320*b*, to produce output 1330.

Output segment 1306 includes a combiner 1332. In an embodiment, combiner 1322 is an in-phase combiner, which combines outputs 1328 and 1330 to produce output 1334. In an embodiment, output 1334 corresponds to the PA output.

According to embodiments, combiners 1308, 1318, and 1306 can each be implemented as a multi-winding flux coupled transformer, a transmission-line transformer (e.g., Guanella, Ruthroff, etc.), a microstrip, a stripline, or a TEM coupler. For high frequency implementations, the combiner can also be implemented using hollow waveguide couplers.

Figure 4:
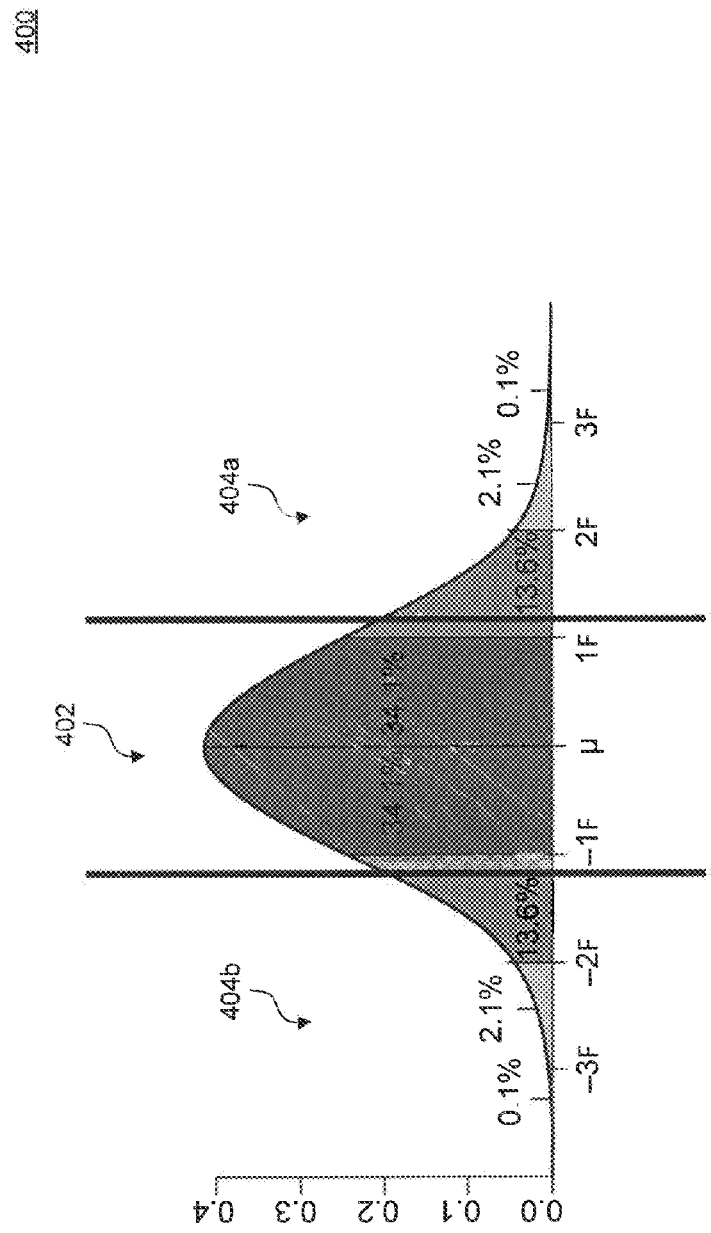
FIG. 4 illustrates a probability density function (PDF) of an example high peak to average ratio (PAR) signal.

FIG. 4 illustrates a probability density function (PDF) 400 of an example high peak to average ratio (PAR) signal. The example PAR signal illustrated in FIG. 4 can be amplified using embodiments, as shown in FIG. 4, by dividing PDF 400 into an inner region 402 that corresponds to samples of the signal with amplitudes within a predetermined amplitude range, and an outer region 404*a-b* that corresponds to samples of the signal with amplitudes outside the predetermined amplitude range. In embodiment, the predetermined amplitude range is selected based on a maximum amplitude amenable for class A amplification, with the predetermined amplitude range encompassing this maximum amplitude. In an embodiment, class A amplification of the signal is used for inner region 402, and class B or B/G amplification is used for outer region 404*a-b*. In other embodiments, PDF 400 can be divided into more or less regions than shown in FIG. 4. For example, PDF 400 can be divided into 5 or 7 regions, where each of outer regions 404*a-b* is further divided into two or more sub-regions.

Figure 5:
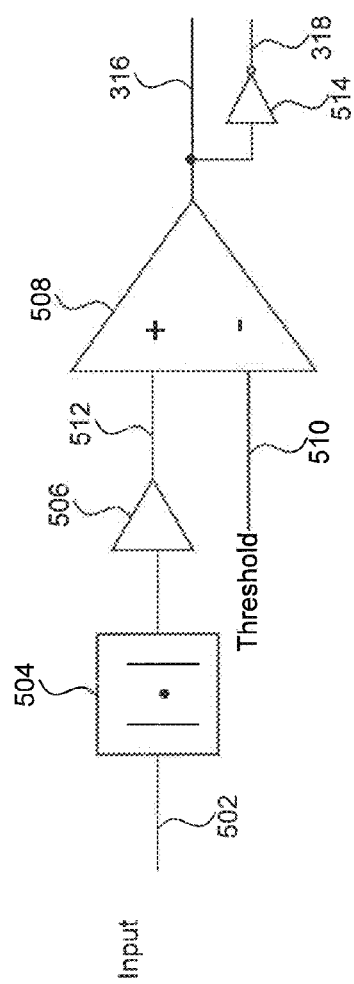
FIG. 5 illustrates an example circuit for generating control signals for the example power amplifier of FIG. 3.

FIG. 5 illustrates an example circuit 500 for generating control signals 318 and 316 for example PA 300 of FIG. 3. Example circuit 500 is provided for the purpose of illustration and is not limiting of embodiments. As shown in FIG. 5, circuit 500 includes a modulus circuit 504, a pre-amplifier 506, and a comparator 508. Modulus circuit 504 receives an input signal 502 and generates the modulus (absolute value) of input signal 502. The output of modulus circuit 504 is pre-amplified using pre-amplifier 506 to generate a signal 512. Signal 512 is then provided to comparator 508 along with a threshold signal 510. Threshold signal 510 represents a predetermined amplitude threshold. Comparator 508 compares signal 512 and threshold signal 510 to generate control signal 316. In an embodiment, control signal 316 is a logic high if signal 512 is larger than threshold signal 510 and a logic low otherwise. Control signal 318 is produced as the complement of control signal 316 via an inverter 514.

Example circuit 500 may also be used to generate the equivalent control signals for later described embodiments, including the embodiments shown in FIGS. 6, 8, and 12, for example. In these and other embodiments, example circuit 500 can be used to generate the control signals with input signal 502 in analog or digital form. Further, input signal 502 may represent the input to the amplitude mapper or the DACs in the power DAC implementations described below.

Figure 6:
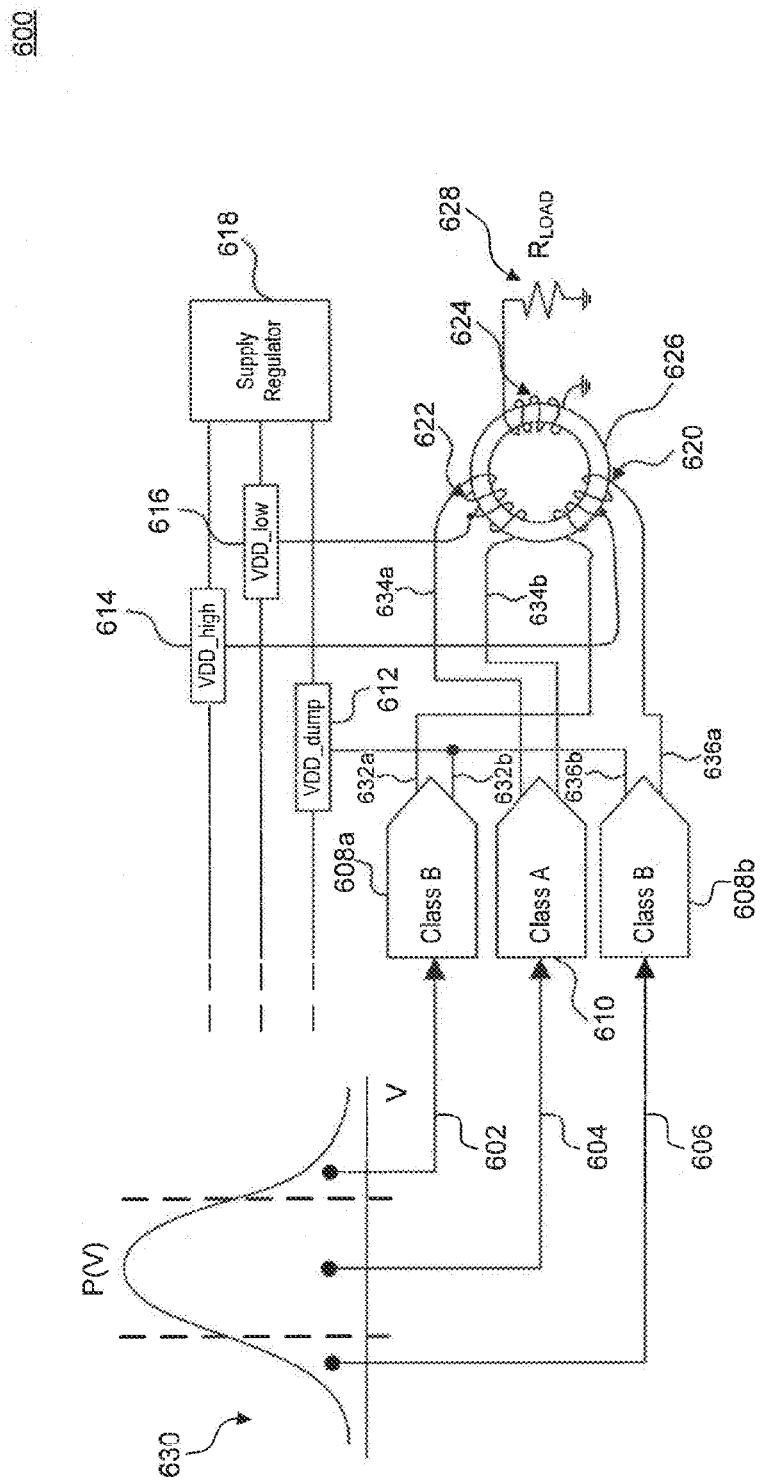
FIG. 6 illustrates an example power digital-to-analog converter (DAC) according to an embodiment.

FIG. 6 illustrates an example power DAC 600 according to an embodiment. Example power DAC 600 is provided for the purpose of illustration and is not limiting of embodiments. As shown in FIG. 6, example power DAC 600 includes an amplitude mapper (not shown in FIG. 6); a plurality of DACs 608*a*, 608*b*, and 610; a combiner having a core 626 and a first winding 622, a second winding 620, and a third winding 624 all coupled to core 626; and a supply regulator 618 for generating a first supply voltage (VDD_low) 616, a second supply voltage (VDD_high) 614, and a third supply voltage (VDD_dump) 612.

The amplitude mapper is configured to receive an input signal and to generate a plurality of constituent signals from the input signal. For example, as shown in FIG. 6, the amplitude mapper receives an input signal having an amplitude PDF 630 and generates input constituent signals 602, 604, and 606. In an embodiment each of input constituent signals 602, 604 and 606 corresponds to a respective portion of the input signal, and a sum of the input constituent signals is equal to the input signal. In other embodiments, the amplitude mapper divides the input signal into more than 3 input constituent signals, each corresponding to a respective portion of the input signal.

Figure 7:
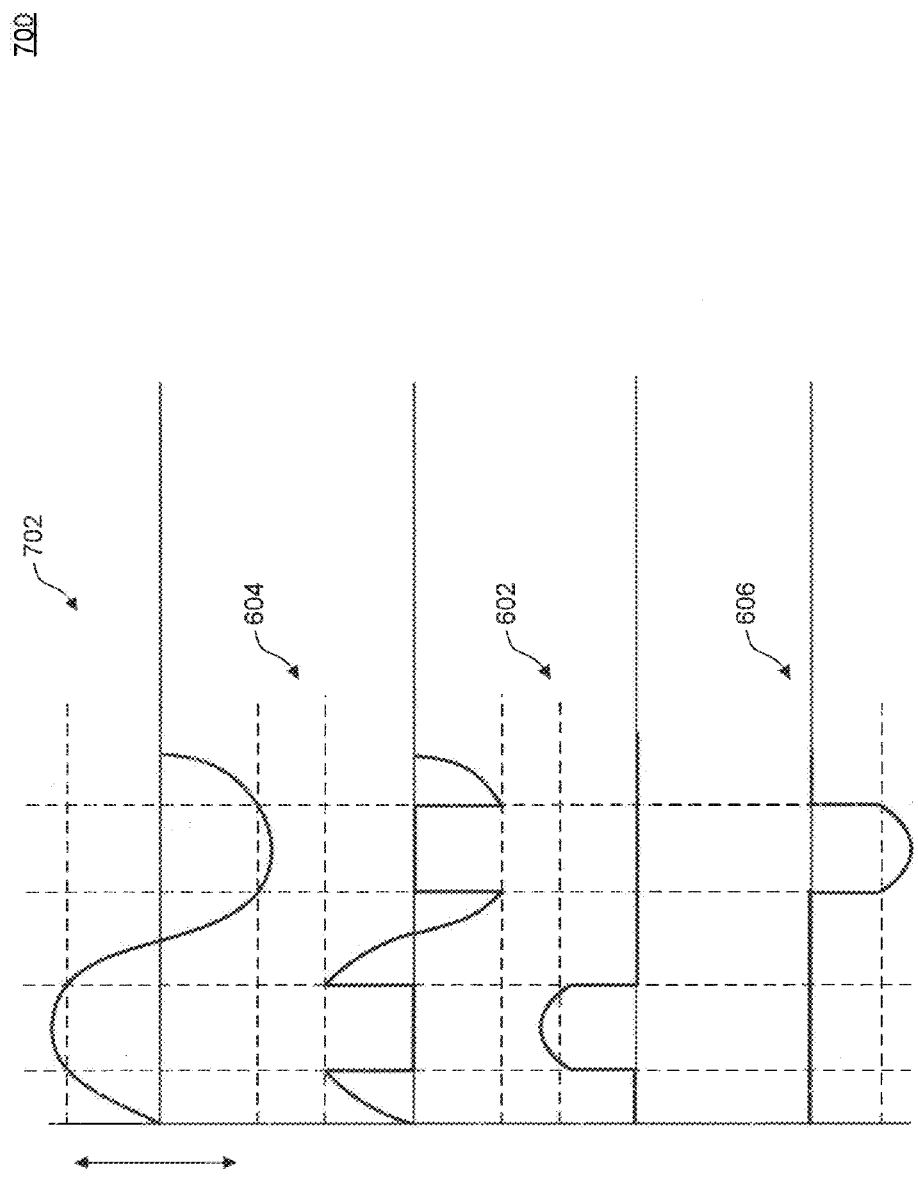
FIG. 7 illustrates an example decomposition of a signal into constituent signals according to an embodiment.

FIG. 7 illustrates an example decomposition of a signal 702 into input constituent signals 604, 602, and 606 according to an embodiment. Signal 702 is shown as a sinusoidal for the purpose of illustration only. As would be understood by a person of skill in the art based on the teachings herein, any signal can be decomposed into input constituent signals as illustrated herein in FIG. 7, and signal decomposition can be done into any number of constituent signals in a myriad of ways.

As shown in FIG. 7, input constituent signal 604 corresponds to signal 702 when signal 702 is within a predetermined amplitude range and is zero otherwise. Input constituent signal 602 corresponds to signal 702 when signal 702 is positive and outside the predetermined amplitude range and is zero otherwise. Input constituent signal 606 corresponds to signal 702 when signal 702 is negative and outside the predetermined amplitude range and is zero otherwise. As can be apparent from FIG. 7, the sum of input constituent signals 602, 604, and 606 results in signal 702. In another embodiment, signal 702 can be decomposed into signal 604 and a second signal, which corresponds to signal 702 when signal 702 is outside the predetermined amplitude range and that is zero otherwise (sum of signals 602 and 606).

Returning to FIG. 6, DACs 608*a*, 608*b*, and 610 are each configured to receive a respective one of input constituent signals 602, 604, and 606 and to generate a respective current output signal. In an embodiment, DAC 610 is a class A DAC, which is configured (e.g., appropriately biased) to receive input constituent signal 604, and DACs 608*a* and 608*b* are class B DACs, which are configured (e.g., appropriately biased) to receive input constituent signals 602 and 606 respectively.

In an embodiment, the amplitude mapper decomposes the input signal according to the manner shown in FIG. 7 above, resulting in input constituent signals 602, 604, and 606 with the same properties described above in FIG. 7. The current output signals produced by DACs 608*a*, 60*b*, and 610 are proportional to input constituents signals 602, 606, and 604, respectively. In an embodiment, the current output signals produced by DACs 608*a*, 608*b*, and 610 are always non-zero because DACs 608*a*, 608*b*, and 610 are never turned off.

In an embodiment, when either of input constituent signals 602 and 606 is zero and thus is not contributing to the output signal of power DAC 600, the current output signal produced by DAC 608a and/or 608b is routed using a respective DAC output signal 632b and/or 636b to third supply voltage 612. Third supply voltage 612 is lower than second supply voltage 614 (and can be lower than first supply voltage 616) and therefore the power inefficiency of DAC 608a and/or 608b can be reduced (when it is not contributing to the output). Alternatively, when input constituent signal 602 or 606 is non-zero and is thus contributing to the output signal of power DAC 600, the current output signal produced by DAC 608a or 608b is routed using a respective DAC output signal 632a or 636a to second winding 620. Second winding 620 is biased at its center tap using second supply voltage 614, which provides the high voltage bias needed for high amplitude samples of the input signal. The above described switched power supply biasing of DACs 608a and 608b results in class BG amplification for high amplitude samples of the input signal.

The current output signal produced by DAC 610 is coupled at all time to first winding 622, which is biased at its center tap using first supply voltage 616. In an embodiment, first supply voltage 616 is selected to provide class A amplification for the input signal. In an embodiment, the current output signal produced by DAC 610 is coupled to first winding 622 using DAC output signals 634a and 634b (differential output).

The combiner combines the respective current signals coupled to first winding 622 and second winding 620 to produce an output current signal in third winding 624. The output current signal produces an output voltage signal across a load $R_L$ 628. It should be noted that the combiner is not limited according to embodiments to a multi-winding flux-coupled transformer as illustrated in FIG. 6. As would be appreciated by a person of skill in the art based on the teachings herein, the combiner can be otherwise implemented as a transmission-line transformer (e.g., Guanella, Ruthroff, etc.), a microstrip, a stripline, or a Transverse ElectroMagnetic (TEM) coupler. For high frequency implementations, the combiner can also be implemented using hollow waveguide couplers. Also, in other embodiments, the combiner can be implemented as illustrated by example combiner 1300. A person of ordinary skill in the art would appreciate based on the teachings herein that example combiner 1300 can be extended to have three (e.g., two outer segments and one inner segment) instead of two input segments, for use with example power DAC 600.

Figure 8:
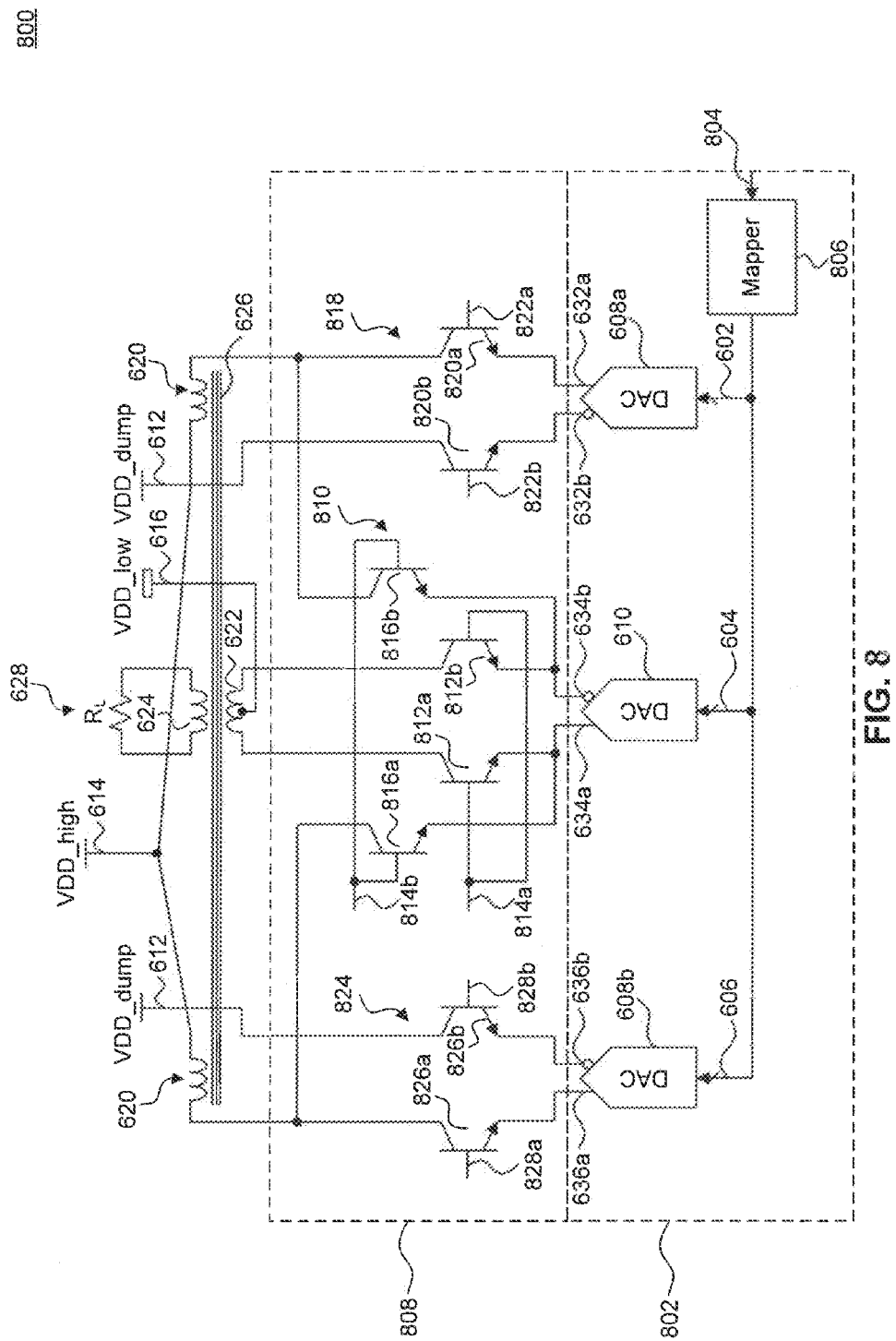
FIG. 8 illustrates another example power DAC according to an embodiment.

FIG. 8 illustrates another example power DAC 800 according to an embodiment. Example power DAC 800 is provided for the purpose of illustration and is not limiting of embodiments. As shown in FIG. 8, example power DAC 800 includes an input stage 802 that includes an amplitude mapper 806 and a plurality of DACs 608a, 608b, and 610; a current steering stage 808 that includes a first current steering cell 810, a second current steering cell 818, and a third current steering cell 824; and a combiner including a core 626 and a first winding 622, a second winding 620, and a third winding 624 all coupled to core 626.

Amplitude mapper 806 is configured to receive an input signal 804 and to generate input constituent signals 602, 604, and 606. In an embodiment, each of input constituent signals 602, 604, and 606 correspond to a respective portion of input signal 804, and a sum of input constituent signals 602, 604, and 606 is equal to input signal 804. In other embodiments, the amplitude mapper divides input signal 804 into more than 3 input constituent signals, each corresponding to a respective portion of the input signal.

Figure 9:
FIG. 9 illustrates an example decomposition of a signal into constituent signals according to an embodiment.

In an embodiment, amplitude mapper 806 decomposes input signal 804 according to the manner shown in FIG. 9 described below. Specifically, input constituent signal 604 corresponds to signal 804 when signal 804 is within a predetermined amplitude range, is a constant that corresponds to the maximum positive amplitude of the predetermined amplitude range when signal 804 is above the maximum positive amplitude of the predetermined amplitude range, and is a constant that corresponds to the maximum negative amplitude of the predetermined amplitude range when signal 804 is below the maximum negative amplitude of the predetermined amplitude range. Input constituent signal 602 corresponds to the difference between signal 804 and the maximum positive amplitude of the predetermined amplitude range when signal 804 is above the maximum positive amplitude of the predetermined amplitude range and is zero otherwise. Input constituent signal 606 corresponds to the difference between signal 804 and the maximum negative amplitude of the predetermined amplitude range when signal 804 is below the maximum negative amplitude of the predetermined amplitude range and is zero otherwise.

Returning to FIG. 8, DACs 608a, 608b, and 610 are each configured to receive a respective one of input constituent signals 602, 604, and 606. In an embodiment, DAC 610 is a class A DAC, which is configured (e.g., appropriately biased) to receive input constituent signal 604, and DACs 608a and 608b are class B DACs, which are configured (e.g., appropriately biased) to receive input constituent signals 602 and 606 respectively. DACs 608a, 608b, and 610 generate respective output current signals, which are proportional to input constituent signals 602, 606, and 604 respectively. In an embodiment, the output current signals produced by DACs 608a, 608b, and 610 are always non-zero because DACs 608a, 608b, and 610 are never turned off.

In an embodiment, when either of input constituent signals 602 and 606 is zero and thus is not contributing to the output signal of power DAC 800 (e.g., input signal 804 is within the predetermined amplitude range), the current output signal produced by DAC 608a and/or 608b is routed using a respective DAC output signal 632b and/or 636b to third supply voltage 612. Third supply voltage 612 is lower than second supply voltage 614 (and can be lower than first supply voltage 616) and therefore the power inefficiency of DAC 608a and/or 608b can be reduced (when it is not contributing to the output). In an embodiment, the coupling of DAC output signal 632b (and/or 636b) to third supply voltage 612 is done by asserting a control signal 822b (and/or 828b) to switch on transistor 820b of second current steering cell 818 (and/or transistor 826b of third current steering cell 824). In an embodiment, control signals 822b and 828b are provided by control circuitry (not shown in FIG. 8), coupled to mapper 806, which provides the control signals in accordance with input constituent signals 602, 606, and 604. The same control circuitry also provides other control signals described below (e.g., 814a, 814b, 822a, and 828a).

Alternatively, when input constituent signal 602 or 606 is non-zero and is thus contributing to the output signal of power DAC 800 (e.g., input signal 804 is outside the predetermined amplitude range), the current output signal produced by DAC 608a or 608b is routed using a respective DAC output signal 632a or 636a to second winding 620. Second winding 620 is biased at its center tap using second supply voltage 614, which provides the high voltage bias needed for high amplitude samples of the input signal (in an embodiment, the input signal is class B amplified). In an embodiment, the coupling of DAC output 632a (or 636a) to second winding 620 is done by asserting a control signal 822a (or 828a) to switch on transistor 820*a* of second current steering cell 818 (or transistor 826*a* of third current steering cell 824).

In an embodiment, the current output signal produced by DAC 610 is coupled at all time to first winding 622, which is biased at its center tap using first supply voltage 616. In an embodiment, first supply voltage 616 is selected to provide class A amplification for the input signal. In an embodiment, the current output signal produced by DAC 610 is coupled to first winding 622 by coupling DAC output signals 634*a* and 634*b* respectively to second winding 622 using respective transistors 812*a* and 812*b* of first current steering cell 810. Transistors 812*a* and 812*b* are controlled by a control signal 814*a*, which is asserted to turn on transistors 812*a* and 812*b*.

In another embodiment, the current output signal produced by DAC 610 is coupled to first winding 622 when input signal 804 is within the predetermined amplitude range and to second winding 620 when input signal 804 is outside the predetermined amplitude range (e.g., peaking events). The coupling of the current output signal produced by DAC 610 to first winding 622 is done as just described above. The coupling of the current output signal produced by DAC 610 to second winding 620 is done by coupling DAC output signals 634*a* and 634*b* via respective transistors 816*a* and 816*b* of first current steering cell 810 to second winding 620. Transistors 816*a* and 816*b* are controlled by a control signal 814*b*, which is asserted to turn on transistors 816*a* and 816*b*. In an embodiment, control signal 814*b* is the complement of control signal 814*a*, thereby the current output signal of DAC 610 is coupled to either first winding 622 or to second winding 620 at any given time. The coupling of the current output signal of DAC, 610 to second winding 620 when input signal 804 is outside the predetermined amplitude range (e.g., peaking events) enables more linear amplification of the input signal when outside the range.

The combiner, as described above with respect to FIG. 6, combines the respective current signals coupled to first winding 622 and second winding 620 to produce an output current signal in third winding 624. The output current signal produces an output voltage signal across load $R_L$ 628. It should be noted that the combiner is not limited according to embodiments to a multi-winding flux-coupled transformer as illustrated in FIG. 8. As would be appreciated by a person of skill in the art based on the teachings herein, the combiner can be otherwise implemented as a transmission-line transformer (e.g., Guanella, Ruthroff, etc.), a microstrip, a stripline, or a Transverse ElectroMagnetic (TEM) coupler. For high frequency implementations, the combiner can also be implemented using hollow waveguide couplers. Also, in other embodiments, the combiner can be implemented as illustrated by example combiner 1300. A person of ordinary skill in the art would appreciate based on the teachings herein that example combiner 1300 can be extended to have three (e.g., two outer segments and one inner segment) instead of two input segments, for use with example power DAC 800.

Figure 10:
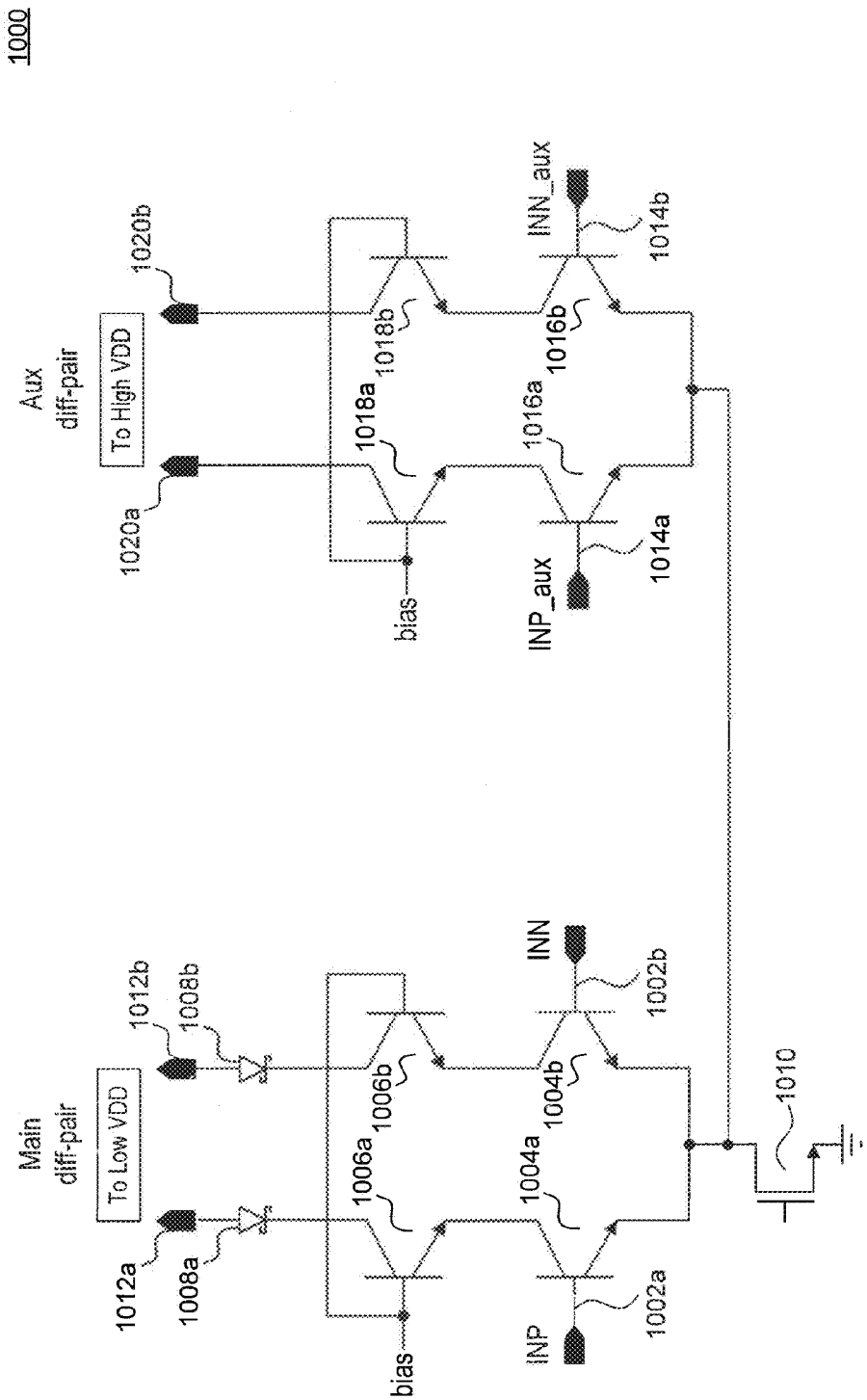
FIG. 10 illustrates an example class A current steering cell according to an embodiment.

FIG. 10 illustrates an example class A current steering cell 1000 according to an embodiment. Example current steering cell 1000 is provided for the purpose of illustration and is not limiting of embodiments. Example current steering cell 1000 can substitute first current steering cell 810 in example power DAC 800 described above in FIG. 8.

As shown in FIG. 10, current steering cell 1000 includes a main branch that includes an input transistor pair 1004*a-b*, a bias transistor pair 1006*a-b*, and a diode pair 1008*a-b*; and an auxiliary branch that includes an input transistor pair 1014*a-b* and a bias transistor pair 1018*a-b*. The main branch provides outputs 1012*a* and 1012*b*, which are coupled to a low supply voltage. The auxiliary branch provides outputs 1020*a* and 1020*b*, which are coupled to a high supply voltage. Both the main branch and the auxiliary branch are coupled to a current source, which is implemented as an NMOS transistor 1010 in example cell 1000. In another embodiment, the current source is provided by a DAC (e.g., 610).

In operation, the output current of NMOS transistor 1010 is steered by the current steering cell 1000 to the low supply voltage and, in some cases, additionally to the high supply voltage. Specifically, when the input signal (e.g., input signal 804) is positive, the output current of NMOS transistor 1010 is steered to output 1012*a* of the main branch. Additionally, when the input signal is also outside a predetermined amplitude range (e.g., peak events), some of the output current of NMOS transistor 1010 is also steered to output 1020*a* of the auxiliary branch. When the input signal is negative, the output current of NMOS transistor 1010 is steered to output 1012*b* of the main branch. Additionally, when the input signal is also outside the predetermined amplitude range (e.g., peak events), some of the output current of NMOS transistor 1010 is also steered to output 1020*b* of the auxiliary branch. Steering of the output current of NMOS transistor 1010 as described above is done using complementary signals 1002*a-b* and 1014*a-b*.

Bias transistor pairs 1006*a-b* and 1018*a-b* ensure that input transistor pairs 1004*a-b* and 1016*a-b* are biased appropriately for class A amplification. Diodes 1008*a-b* prevent the forward biasing of the base-collector junctions of input transistors 1004*a-b* respectively, when the auxiliary branch is being used to steer current to the high supply voltage.

Figure 11:
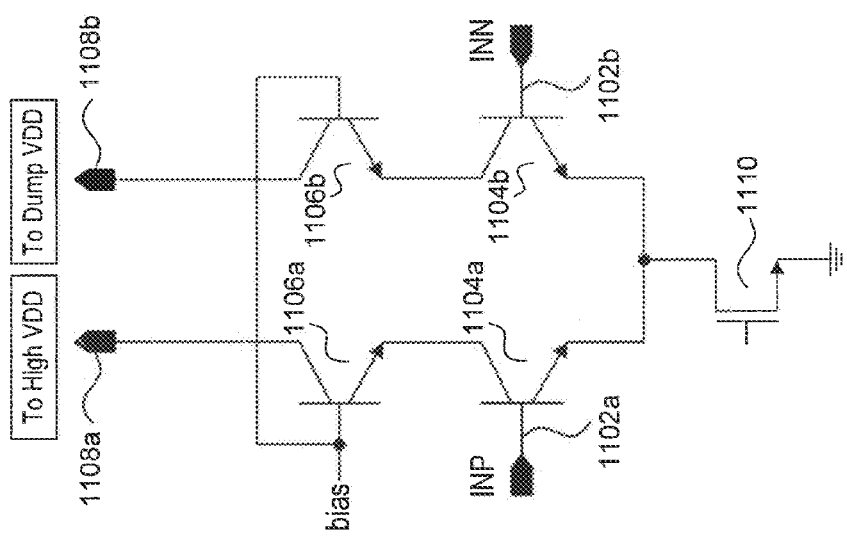
FIG. 11 illustrates an example class B current steering cell according to an embodiment.

FIG. 11 illustrates an example class B current steering cell 1100 according to an embodiment. Example current steering cell 1100 is provided for the purpose of illustration and is not limiting of embodiments. Example current steering cell 1100 can substitute second current steering cell 818 in example power DAC 800 described above in FIG. 8. It is noted that class B amplification as used herein does not correspond to conventional class B amplification, wherein the amplifier conducts only 50% of the signal cycle time. Instead, class B amplification is used herein to describe amplification whereby the amplifier/DAC conducts all the time but where the conducting current is coupled to a low supply voltage for the unused portions of the signal cycle (rather than the amplifier itself being off).

As shown in FIG. 11, current steering cell 1100 includes an input transistor pair 1104*da-b* and a bias transistor pair 1106*a-b*, and provides outputs 1108*a*, and 1108*b*. In an embodiment, bias transistor pair 1106*a-b* ensures that input transistor pair 1104*a-b* are biased appropriately for class B amplification.

Output 1108*a* is coupled to a high supply voltage, and output 1108*b* is coupled to a low supply voltage (dump supply voltage). A current source, which is implemented as an NMOS transistor 1110 in example cell 1100 (in another embodiment, the current source is provided by a DAC (e.g., 608*a*)), sinks current from either the high supply voltage or the dump supply voltage branch of the cell. Specifically, when the input signal (e.g., input signal 804) is positive and outside a predetermined amplitude range (e.g., positive amplitude peak events), the output current of NMOS transistor 1110 is steered to output 1108*a* for coupling to the high supply voltage. When the input signal is within the predetermined amplitude range, the output current of NMOS transistor 1010 is steered to output 1108*b* for coupling to the dump supply voltage.

Figure 12:
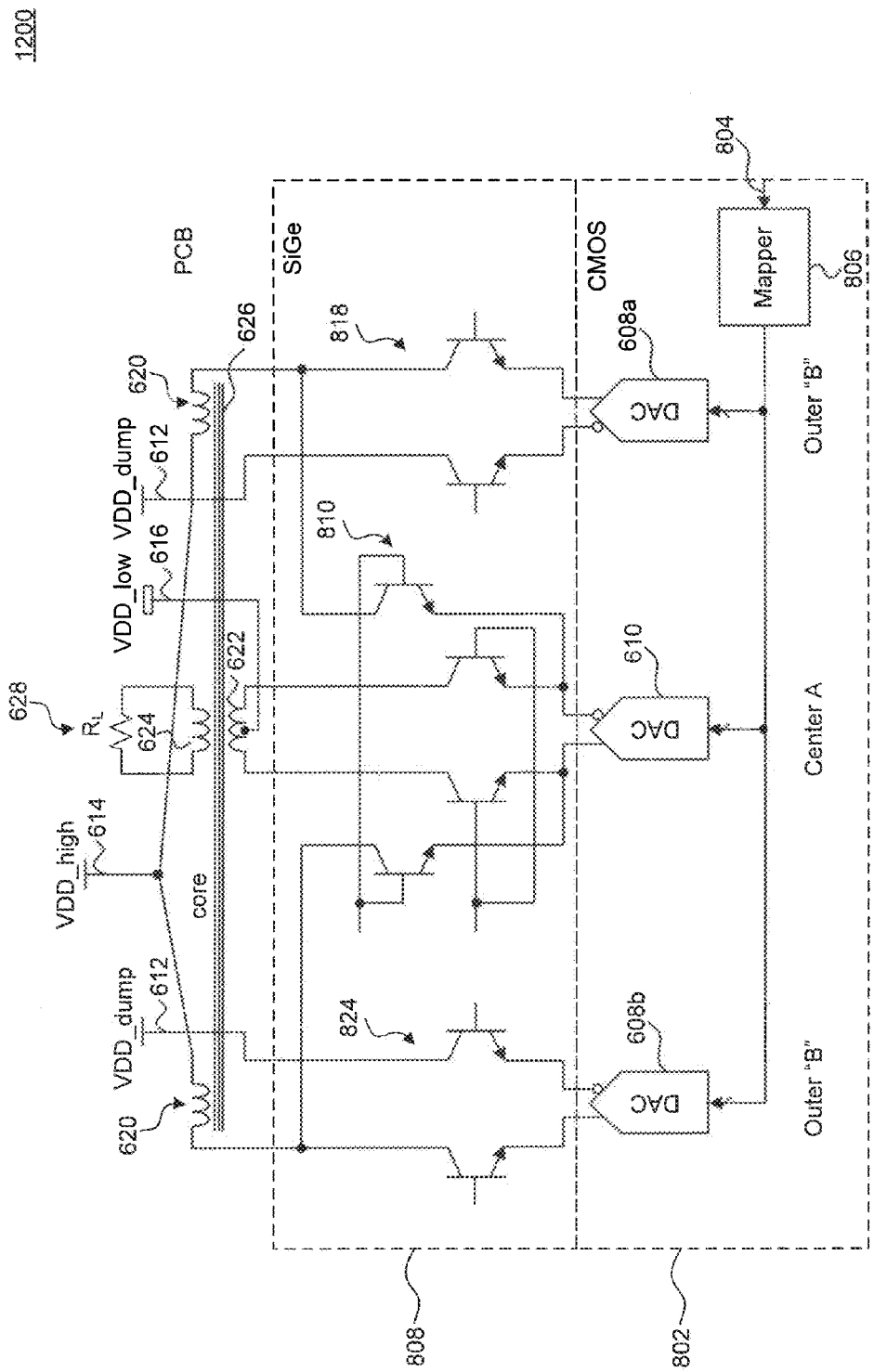
FIG. 12 illustrates an example implementation of the power DAC of FIG. 8 according to an embodiment.

FIG. 12 illustrates an example implementation of example power DAC 800 described above in FIG. 8 according to an embodiment. Specifically, in this embodiment, power DAC 800 is implemented using a multi-chip module (MCM) on a single printed circuit board (PCB). Input stage 802, which includes amplitude mapper 806 and DACs 608a, 608b, and 610, is implemented in a first chip using a first process, which can be a CMOS process, for example. Typically, CMOS processes can withstand high currents but only low voltages. Current steering stage 808 is implemented in a second chip using a second process, which can be a SiGe or a GaAs process, for example. SiGe or GaAs processes can typically withstand high voltages, and thus protect the CMOS process in this example implementation. The combiner is implemented on the same PCB. As would be understood by a person of skill in the art based on the teachings herein, this example implementation is provided for the purpose of illustration only and is not limiting of embodiments.

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of embodiments of the present disclosure should not be limited by any of the above-described exemplary embodiments, but should be defined only in accordance with the following claims and their equivalents.

What is claimed is:

1. A power digital-to-analog converter (DAC), comprising:
    an amplitude mapper configured to receive an input signal and to generate a first input constituent signal and a second input constituent signal from the input signal;
    a first DAC configured to receive the first input constituent signal and to generate a first current signal;
    a second DAC configured to receive the second input constituent signal and to generate a second current signal; and
    a combiner configured to combine the first and second current signals to generate an output signal of the power DAC,
    wherein the first DAC is biased with a first supply voltage, and
    wherein the second DAC is biased with a second supply voltage higher than the first supply voltage when the second input constituent signal is non-zero, and is biased with a third supply voltage lower than the first supply voltage when the second input constituent signal is zero.

2. The power DAC of claim 1, wherein each of the first and second input constituent signals corresponds to a respective portion of the input signal, and wherein a sum of the first and second input constituent signals is equal to the input signal.

3. The power DAC of claim 1, wherein the first input constituent signal corresponds to samples of the input signal that are within a predetermined amplitude range, and wherein the second input constituent signal corresponds to samples of the input signal that are outside the predetermined amplitude range.

4. The power DAC of claim 1, further comprising:
    a current steering stage configured to selectively couple the first and second current signals to the combiner.

5. The power DAC of claim 4, wherein the combiner comprises:
    a first winding biased with the first supply voltage;
    a second winding biased with the second supply voltage;
    an output winding, coupled to a load, configured to generate the output signal of the power DAC.

6. The power DAC of claim 5, wherein the current steering stage comprises:
    a first current steering cell configured to couple the first current signal of the first DAC to the first winding when the input signal is within a predetermined amplitude range and to the second winding when the input signal is outside the predetermined amplitude range; and
    a second current steering cell configured to couple the second current signal of the second DAC to a dump supply voltage when the input signal is within the predetermined amplitude range and to the second winding when the input signal is outside the predetermined amplitude range.

7. The power DAC of claim 6, wherein the dump supply voltage corresponds to the third supply voltage.

8. The power DAC of claim 4, wherein the power DAC is implemented in a multi-chip module (MCM).

9. The power DAC of claim 8, wherein the MCM comprises:
    a first chip comprising the first and second DACs, implemented using a first process; and
    a second chip comprising the current steering stage, implemented using a second process.

10. A power digital-to-analog converter (DAC), comprising:
    an amplitude mapper configured to receive an input signal and to generate a first input constituent signal that corresponds to samples of the input signal that are within a predetermined amplitude range, and a second input constituent signal that corresponds to samples of the input signal that are outside the predetermined amplitude range;
    a first DAC configured to receive the first input constituent signal and to generate a first current signal;
    a second DAC configured to receive the second input constituent signal and to generate a second current signal; and
    a current steering stage configured to couple the first current signal to a first supply voltage when the input signal is within the predetermined amplitude range and to couple the second current signal to a second supply voltage higher than the first supply voltage when the input signal is outside the predetermined amplitude range.

11. The power DAC of claim 10, wherein the current steering stage is further configured to couple the first current signal to the second supply voltage when the input signal is outside the predetermined amplitude range, and to couple the second current signal to a dump supply voltage lower than the first supply voltage when the input signal is within the predetermined amplitude range.

12. The power DAC of claim 11, wherein the current steering stage comprises a class A current steering cell configured to selectively couple the first current signal to the first supply voltage or the second supply voltage, and a class B current steering cell configured to selectively couple the second current signal to the second supply voltage or the dump supply voltage.

13. The power DAC of claim 10, wherein the first DAC is biased with the first supply voltage, and wherein the second DAC is biased with the second supply voltage when the input signal is outside the predetermined amplitude range.

14. The power DAC of claim 10, wherein a sum of the first input constituent signal and the second input constituent signal is equal to the input signal.

15. A power amplifier, comprising:
an input stage configured to receive an input signal and to generate first and second current signals; and
a current steering stage configured to selectively couple the first and second current signals to a first supply voltage when the input signal is within a predetermined amplitude range and to a second supply voltage higher than the first supply voltage when the input signal is outside the predetermined amplitude range.

16. The power amplifier of claim 15, further comprising:
a combiner configured to combine the first and second current signals to produce an output current signal in a load.

17. The power amplifier of claim 16, wherein the combiner comprises:

a first winding having a center tap biased with the first supply voltage;
a second winding having a center tap biased with the second supply voltage; and
an output winding, coupled to the load, configured to generate the output current signal.

18. The power amplifier of claim 17, wherein the current steering stage is configured to couple the first and second currents to the first winding when the input signal is within the predetermined amplitude range and to the second winding when the input signal is outside the predetermined amplitude range.

19. The power amplifier of claim 15, wherein the input stage includes a digital-to-analog converter (DAC).

20. The power amplifier of claim 15, wherein the input stage comprises:
an amplitude mapper configured to receive the input signal and to generate a first input constituent signal and a second input constituent signal from the input signal;
a first DAC configured to receive the first input constituent signal and to generate the first current signal; and
a second DAC configured to receive the second input constituent signal and to generate the second current signal.

* * * * *